(12) United States Patent
Rassaian et al.

(10) Patent No.: US 7,925,475 B2
(45) Date of Patent: Apr. 12, 2011

(54) ANALYZING STRUCTURAL DESIGN RELATIVE TO VIBRATIONAL AND/OR ACOUSTIC LOADING

(75) Inventors: Mostafa Rassaian, Bellevue, WA (US); Jung-Chuan Lee, Federal Way, WA (US)

(73) Assignee: The Boeing Company, Chicago, IL (US)

(*) Notice: Subject to any disclaimer, the term of this patent is extended or adjusted under 35 U.S.C. 154(b) by 945 days.

(21) Appl. No.: 11/375,225

(22) Filed: Mar. 14, 2006

(65) Prior Publication Data

US 2007/0220454 A1    Sep. 20, 2007

(51) Int. Cl.
 *G06F 17/50* (2006.01)
(52) U.S. Cl. .............................................. 703/1; 702/33
(58) Field of Classification Search ...................... 703/1
 See application file for complete search history.

(56) References Cited

U.S. PATENT DOCUMENTS

| | | | |
|---|---|---|---|
| 5,767,406 A * | 6/1998 | Hu .................................. | 73/578 |
| 5,940,788 A * | 8/1999 | Morman et al. .............. | 702/138 |
| 6,090,147 A * | 7/2000 | Bremner et al. .................. | 703/1 |
| 6,363,789 B1 | 4/2002 | Rassaian et al. ................ | 73/663 |
| 6,704,664 B2 * | 3/2004 | Su et al. .......................... | 702/34 |
| 6,763,310 B2 * | 7/2004 | Lafleur et al. .................... | 702/33 |
| 7,120,544 B2 * | 10/2006 | Duncan ........................... | 702/50 |
| 2003/0114995 A1* | 6/2003 | Su et al. .......................... | 702/34 |
| 2007/0100565 A1 | 5/2007 | Gosse et al. ..................... | 702/34 |

OTHER PUBLICATIONS

Cunningham et al, "Dynamic Response of Doubly Excited Curved Honeycomb Sandwich Panels to Random Acoustic Excitation. Part 2: Theoretical Study", Journal of Sound and Vibration 264, pp. 605-637, 2003.*

Allen et al, "Integration of Finite Element and Boundary Element Methods for Calculating the Radiated Sound from a Randomly Excited Structure", Computers and Structures 77, pp. 155-169, 2000.*

Birgersson et al, "Application of the Spectral Finite Element Method to Turbulent Boundary Layer Induced Vibration of Plates", Journal of Sound and Vibration, 259(4), pp. 873-891, 203.*

Crocker, M. J., "Theoretical and Experimental Response of Panels to Turbulent Boundary Layer Pressure Fluctuations and Separated Flow-Some Preliminary Results", Wyle Laboratories, Report No. WR 67-8, Jul. 1967.*

Gosse, "Strain Invariant Failure Theory: Failure Theory and Methodologies for Implementation," http://www.compositn.net/Downloads/Presentation%20-%20Modelling%20-%20Boeing.pdf; 16 pages, 2003.

Gosse, "A Damage Functional Methodology for Assessing Post-Damage Initiation Environments in Composite Structure," American Institute of Aeronautics and Astronautics; pp. 1-5; Apr. 2004.

(Continued)

*Primary Examiner* — Mary C Jacob

(74) *Attorney, Agent, or Firm* — Harness, Dickey & Pierce, P.L.C.

(57) ABSTRACT

A computer-performed method of designing a structure. User-selected design parameters are input to a parametric model of the structure. Boundary conditions and load conditions are applied to the model to determine a response of the structure to the conditions. Based on the load conditions, an analysis method is selected. The modeled response is analyzed using the selected analysis method to obtain power spectral density (PSD) values for the model. The PSD values are averaged over a user-selected frequency range to evaluate the design parameters for acoustic transmission loss. This method provides a high degree of flexibility in formulating structural design analyses.

19 Claims, 3 Drawing Sheets

OTHER PUBLICATIONS

Tay, et al., Damage progression by the element-failure method (EFM) and strain invariant failure theory (SIFT); Composites Science and Technology, vol. 65, pp. 935-944; 2004.

Li, et al., "Application of a First Invariant Strain Criterion for Matrix Failure in Composite Materials," Journal of Composite Materials, vol. 37, No. 22, pp. 1977-2000; Apr. 2003.

Tsai, et al., "Methodology for Composite Durability Assessment," SAMPE Technical Conference, Dayton, Ohio; Sep. 2003.

Barlow, "Optimal Stress Locations in Finite Element Models," International Journal for Numerical Methods in Engineering, vol. 10, pp. 243-251; 1976.

Barlow, "More on Optimal Stress Points—Reduced Integration, Element Distortions and Error Estimation," International Journal for Numerical Methods in Engineering, vol. 28, No. 7, pp. 1487-1504; Jul. 1989.

Li, et al., "Low-velocity impact-induced damage of continuous fiber-reinforced composite laminates. Part I. An FEM numerical model," Composites Part A: Applied Science and Manufacturing, vol. 33, No. 8, pp. 1055-1062; Aug. 1, 2002.

Caliskan, "Axial & Lateral Impact Prediction of Composite Structures Using Explicit Finite Element Analysis," Proceedings of the International Mechanical Engineering Congress and Exposition, pp. 41-49; 2002.

Search Report and Written Opinion for PCT/US2006/043074 dated Mar. 21, 2007.

Tay et al., "Element-Failure: An Alternative to Material Property Degradation Method for Progressive Damage in Composite Structures," Journal of Composite Materials, vol. 39, No. 18, pp. 1659-1675; Jun. 14, 2005.

Caruthers et al., "A Thermodynamically Consistent, Nonlinear Viscoelastic Approach for Modeling Glassy Polymers," Polymer, vol. 45, pp. 4577-4597; 2004.

Adolf et al., "Extensive Validation of a Thermodynamically Consistent, Nonlinear Viscoelastic Model for Glassy Polymers," Polymer, vol. 45, pp. 4599-4621; 2004.

Izhak Bucher, "Parametric Optimization of Structures Under Combined Base Motion Direct Forces and Static Loading", Transactions of the ASME, vol. 124, Jan. 2002, pp. 132-140.

Michael Allen, Nickolas Vlahopoulos, "Noise generated from a flexible and elastically supported structure subject to turbulent boundary layer flow excitation", Elsevier, Finite Elements in Analysis and Design 37 (2001); pp. 687-712.

PCT International Search Report and Written Opinion of the International Searching Authority, International application No. PCT/US2007/006523; date of mailing May 23, 2008.

* cited by examiner 169.9 Hz 173.9 Hz 172.1 Hz 172.6 Hz

ANALYZING STRUCTURAL DESIGN RELATIVE TO VIBRATIONAL AND/OR ACOUSTIC LOADING

FIELD

The present disclosure relates generally to designing structures and more particularly (but not exclusively) to analyzing responses of a structural model to optimize a structural design.

BACKGROUND

The statements in this section merely provide background information related to the present disclosure and may not constitute prior art.

Commercial aircraft are expected to withstand a wide range of pressure conditions and turbulence during flight. Evaluation of design concepts for structures subjected to such conditions typically has involved lengthy and complex analysis and testing procedures.

SUMMARY

In one implementation, the disclosure is directed to a computer-performed method of designing a structure. One or more user-selected design parameters are received. The design parameters are input to a parametric model of the structure. One or more boundary conditions and one or more load conditions are applied to the model to simulate a response of the structure to the conditions. Based on at least one of the load conditions, an analysis method is selected. The simulated response is analyzed using the selected analysis method to obtain one or more power spectral density (PSD) values for the model. The PSD values are averaged over a user-selected frequency range to evaluate the design parameters.

Further areas of applicability will become apparent from the description provided herein. It should be understood that the description and specific examples, while indicating various preferred embodiments of the disclosure, are intended for purposes of illustration only and are not intended to limit the scope of the present disclosure.

DRAWINGS

The drawings described herein are for illustrative purposes only and are not intended to limit the scope of the present disclosure in any way.

DETAILED DESCRIPTION

The following description is merely exemplary in nature and is in no way intended to limit the present disclosure, application, or uses.

The present disclosure, in some implementations, is directed to a system and methods for analyzing structural finite element models under aero-acoustic loading with pressure and/or thermal preloading. Although various implementations of the disclosure are described with reference to aircraft and panel structures in aircraft, the disclosure is not so limited. The disclosure may be implemented in connection with various kinds of structures and in various environments.

The present disclosure, in some implementations, is directed to a computer-performed method of designing a structure, e.g., a panel or other structure of an aircraft. In one implementation, a computer receives one or more user-selected design parameters. The design parameters are input to a parametric model of the structure. The computer applies one or more boundary conditions and one or more load conditions to the model to calculate response of the structure to the conditions. Based on at least one of the load conditions, the computer selects an analysis method. The computer uses the selected analysis method to analyze the modeled response, to obtain one or more power spectral density (PSD) values for the model. The computer averages the PSD values over a user-selected frequency range to evaluate the design parameters. If the design parameters are not yet optimized, the computer may adjust the design parameters and repeat the foregoing method until the design parameters are optimized.

Figure 1:
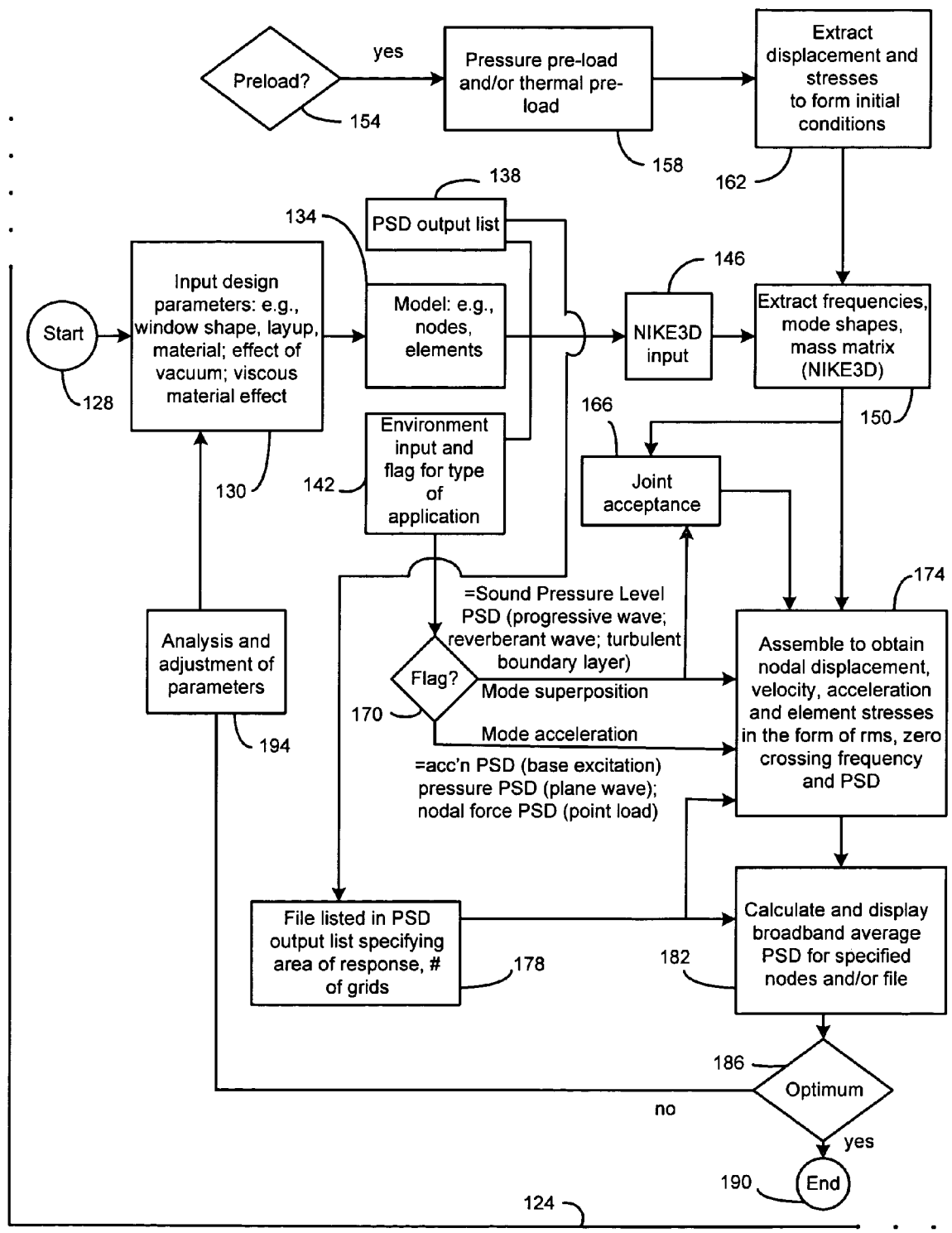
FIG. 1 is a flow diagram of a method of designing a structure in accordance with one implementation of the disclosure.

An exemplary implementation of a method of designing a structure is indicated generally in FIG. 1 by reference number 120. The method 120 may be performed by one or more computer, indicated conceptually by reference number 124, having one or more processors and memory. It may be desirable in some cases for the method 120 to be implemented on more than one computer, for example, in a distributed queuing environment. For the sake of simplicity, however, the present disclosure shall refer to only one computer 124. A user interface (not shown), e.g., a monitor, laptop or other display capability in communication with the computer 124, may be used to receive user input and to display results of the method 120.

In the present example, the method 120 is used to optimize a design for a window panel for an aircraft. The method 120 is commenced in block 128. In block 130, the computer 124 receives one or more user-selected design parameters. Such parameters may specify, e.g., window shape(s), layup(s), material(s), effect(s) of vacuum and/or viscous material effect(s).

The design parameters are input to a parametric model of the window panel structure in block 134. The model includes nodes and elements, e.g., brick and/or shell elements, describing geometry of the structure, e.g., in a format compatible with NIKE3D, a known three-dimensional finite element tool. It should be noted, however, that the disclosure could be implemented in connection with finite element tools other than NIKE3D, for example, NASTRAN, ANSYS, or ABAQUS. The model also includes one or more pressure boundary conditions specifying elements of acoustic load to be applied during model simulation.

A power spectrum density (PSD) output list is input by the user in block 138 to the computer 124. The PSD output list is used to indicate model elements for which stress PSDs are to be computed as further described below. The PSD output list also includes model nodes for which displacement, velocity and/or acceleration PSDs are to be computed. If average value over an area such a window pane is needed, a file name that specifies the area of interest may be specified instead of nodes or elements. The PSD output list also may include a frequency range over which an average PSD is to be calculated, e.g., for implementations in which it may not be desirable or feasible to calculate a PSD average over a full spectrum.

An environment file is input by the user in block 142 to the computer 124. The environment file includes data descriptive of an environment in which the model is to be simulated. The environment file may include data specifying one or more of a plurality of load conditions that may be user-selected for application to the model. Such load conditions may include, for example, a progressive wave, a reverberant wave, a turbulent boundary layer, a base excitation, a plane wave, and/or a point load.

The environment file also includes a flag indicating which of the load conditions is selected for application to the model. Structural damping information may also be included in the environment file. In block 146 the computer 124 formats data in the parametric model, the output list and the environment file into a NIKE3D input deck for eigensolution. In block 150, the input deck from block 146 is input to NIKE3D.

It may be desirable to preload the model with initial stress data, e.g., initial thermal and/or pressure conditions. Initial condition data may include, for example, a TOPAZ plotfile of thermal data. TOPAZ is maintained by Lawrence Livermore National Laboratory. Accordingly, in block 154 it is determined whether preloading is to be performed. If yes, then in block 158 pressure preload data and/or thermal preload data are input and processed to obtain a NIKE3D input deck in block 162. The preload input deck also is input to NIKE3D in block 150.

In block 150, NIKE3D is executed to simulate the model. NIKE3D extracts eigenvalues and eigenvectors representing frequencies and mode shapes of the structure. A mass matrix also is extracted. In block 166, the data extracted in block 150 is used to obtain data representative of joint acceptance between the structure model and the applied load condition(s).

In block 170 the previously mentioned flag of the environment file is tested to determine which load condition is being applied to the model. Dependent on load condition type, in block 174 the computer 124 may perform one of a plurality of analysis methods. For example, for sound pressure level PSDs (where the load condition is, e.g., a progressive wave, a reverberant wave or a turbulent boundary layer), a mode superposition method is performed. For acceleration PSDs, pressure PSDs or nodal force PSDs, a mode acceleration method is performed in block 174. Where mode superposition is performed relative to an appropriate load condition, the load condition is supplied to block 166 for use in calculating joint acceptance data.

In block 174 the computer 124 assembles the frequencies, mode shapes and mass matrix from block 150 and, for appropriate load conditions, joint acceptance data from block 166, to obtain nodal displacement, velocity, acceleration PSDs and/or element stresses in the form of rms (root-mean-square), zero-crossing frequency, and PSD. For base excitation, point loading and pressure loading conditions, assembly is straightforward, following a mode acceleration formulation. For acoustic loading conditions, structural behavior is treated by finite element modeling (FEM) and acoustic behavior is treated using spatial correlation via joint acceptance, which describes the coupling between an excitation pressure field and a structure represented by its normal vibration modes. It should be noted that other or additional methods of analysis may be performed relative to various types of loading. For example, in some implementations, random vibration and/or harmonic vibration may be analyzed.

In block 178, the computer 124 retrieves input from the PSD output list (previously referred to with reference to block 138) for use in block 174. File input may specify nodes, files, and/or elements of the model for which PSD displacement, velocity and acceleration are to be computed. If a file is specified, the file includes an area of the response and number of grids over which broadband average value is calculated. Also included in a file may be a frequency range, previously discussed with reference to block 138, over which broadband average value is to be calculated in block 174.

Nodal displacement, velocity, and/or acceleration PSDs from block 174 may be displayed in graphic format and are used in block 182 to calculate and display broadband average PSD for the specified nodes and/or file. Broadband average PSDs also may be displayed in graphic format.

In block 186, the design parameters are evaluated with reference to the foregoing PSD values and averages. If the design parameters are evaluated as optimal, the method terminates in block 190. If the design parameters are not evaluated as optimal, the computer 124 in block 194 performs sensitivity analysis on the parameters, adjusts them accordingly, and control returns to block 130. Blocks of the method 120 may be repeated, for example, until the design parameters converge to an optimized design for the structure.

Figure 2:
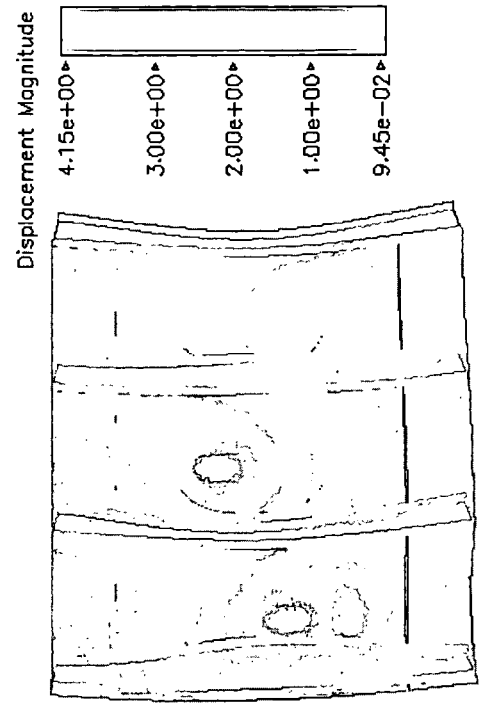
FIG. 2 illustrates a group of screen shots of mode shapes of four pressurized modes of the belt model response in accordance with one implementation of the disclosure.
Figure 2:
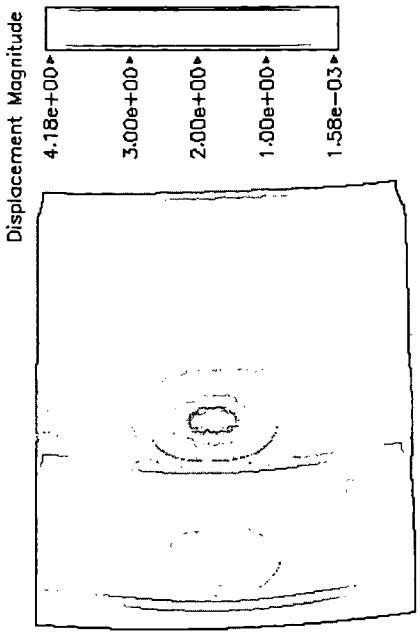
Figure 2:
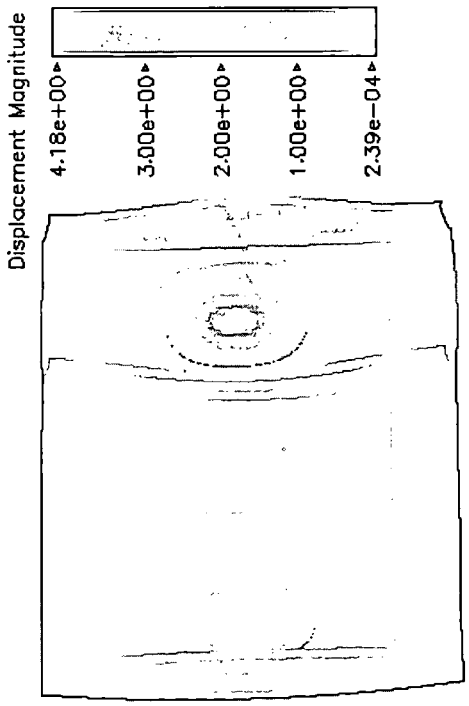
Figure 2:
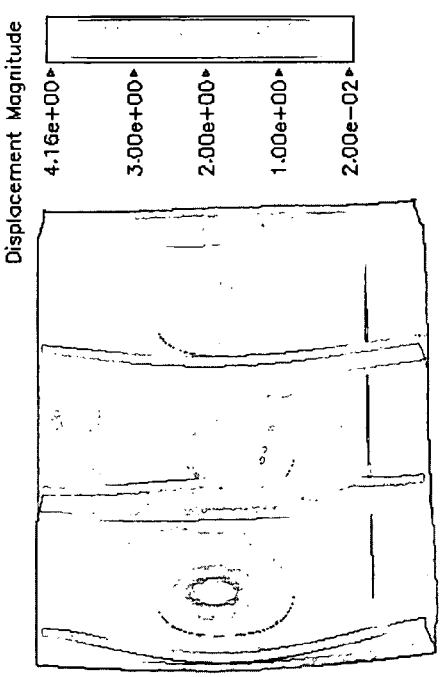
Figure 3:
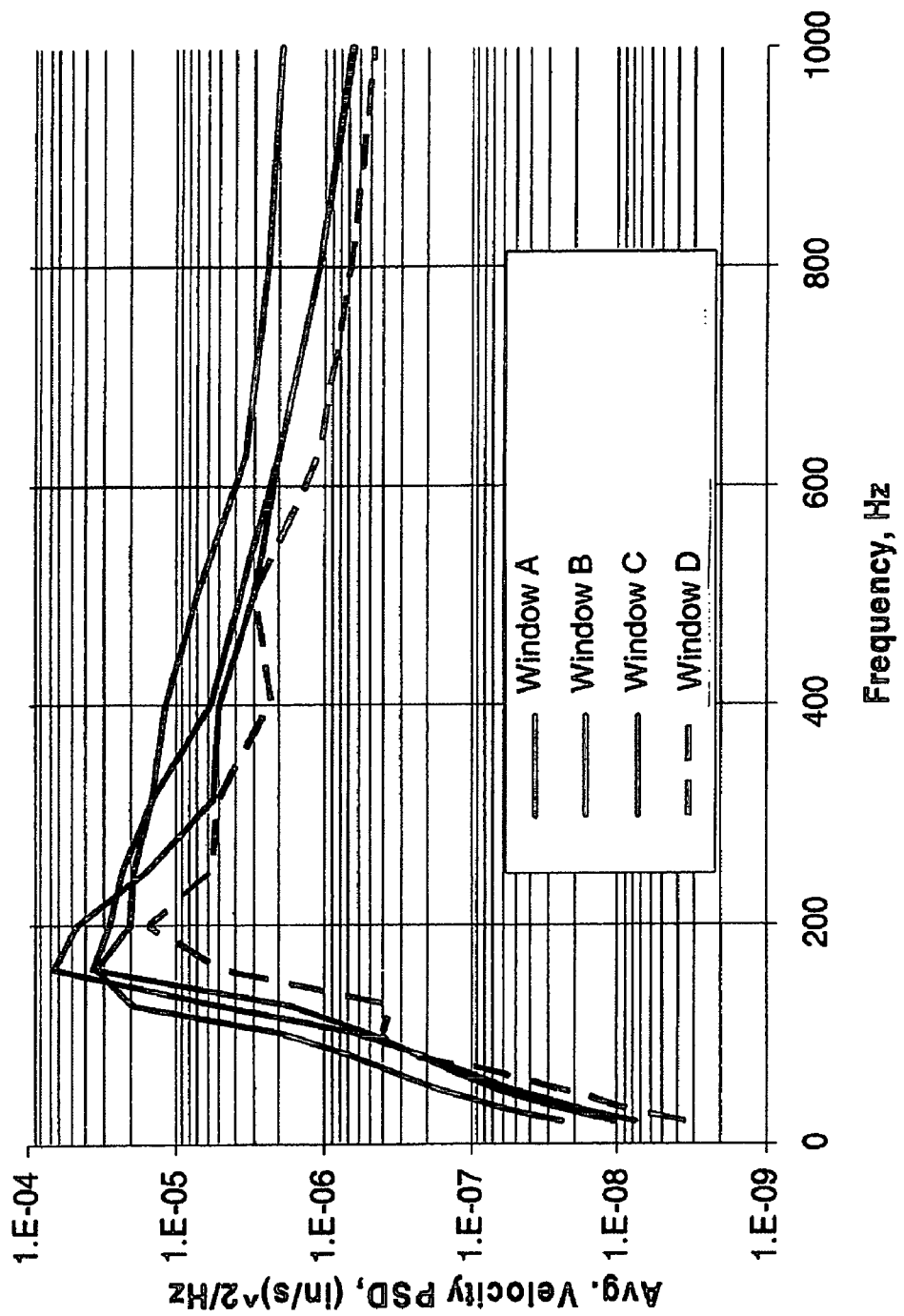
FIG. 3 is graph of average broadband velocity PSD for four window types in accordance with one implementation of the disclosure.

In one exemplary implementation of the disclosure, the effect of boundary conditions on an aircraft window was investigated. A three-bay window belt finite element model was constructed. An implementation of the disclosure was used to perform noise-structural coupling. Velocity PSD was selected as a parameter for evaluating the window performance under turbulent boundary layer wave (TBL) as a source of excitation. The model was used to evaluate window response in terms of the velocity PSD over an array of nodes on the interior pane. Exemplary mode shapes of four pressurized modes of the belt model response are shown in FIG. 2. Average broadband velocity PSD for a window model may be displayed as shown in FIG. 3. Exemplary results of analyses for four window types are shown in FIG. 3.

The foregoing methods and system make it possible to develop a series of design curves with clear trends that aid in achieving optimal structural designs. A variety of load conditions can be simulated for structural analysis, and a variety of model responses can be analyzed. The foregoing methods and system provide a high degree of flexibility in analyzing all and/or part of a structural design.

While various preferred embodiments have been described, those skilled in the art will recognize modifications or variations which might be made without departing from the inventive concept. The examples illustrate the disclosure and are not intended to limit it. Therefore, the description and claims should be interpreted liberally with only such limitation as is necessary in view of the pertinent prior art.

What is claimed is:

1. A method of designing a structure, the method comprising:

receiving one or more user-selected design parameters;

inputting the design parameters to a parametric model of the structure;

representing one or more load conditions as one or more input power spectral density (PSD) values that define one or more excitation conditions, applying one or more boundary conditions and the one or more input PSD values to the model to simulate a response of the structure to the one or more load conditions;

based on a type of the one or more input PSD values representing at least one of the one or more load conditions, selecting a modal analysis method;

analyzing the simulated response using the selected analysis method to obtain power spectral density (PSD) values representing nodal displacement, nodal acceleration, nodal velocity, and element stress for user-selected structural elements of the model;

averaging at least some of the obtained PSD values over a user-selected frequency range to evaluate effects of excitation-structural coupling on the structure; and based on the averaged PSD values, adjusting the design parameters for convergence toward an optimized design for the structure;

the method performed by one or more processors and memory.

2. The method of claim 1, further comprising:
preloading onto the model data representing one or more initial stress conditions affecting the structure; and including effects of the initial stress conditions in the simulated response.

3. The method of claim 2, the initial stress conditions comprising at least one of a thermal condition and a pressure condition.

4. The method of claim 1, further comprising:
based on the selected analysis method, using the simulated response to obtain joint acceptance data and analyzing the simulated response using the joint acceptance data.

5. The method of claim 1, wherein the one or more boundary conditions include a pressure boundary condition.

6. The method of claim 1, further comprising:
receiving from the user a specification of a portion of the model for which the analyzing and averaging are to be performed; and
performing the analyzing and averaging for the specified portion.

7. The method of claim 1, wherein representing one or more load conditions comprises representing one or more of the following: a progressive wave, a reverberant wave, a turbulent boundary layer, a base excitation, a plane wave, and a point load.

8. A method of optimizing a design of a structure comprising:
inputting one or more design parameters selected by a user to a parametric model of the structure;
preloading the model with data representing one or more initial stresses on the structure and simulating a response by the stressed structure to the initial stresses;
receiving one or more excitation conditions specified by the user as one or more input power spectral density (PSD) values;
applying one or more boundary conditions and one or more of the input PSD values to the model to obtain data descriptive of a response of the stressed structure to the one or more excitation conditions;
based on a type of input PSD representing at least one of the one or more specified excitation conditions, selecting one of a plurality of frequency-domain analysis methods;
using the selected analysis method to analyze the data to obtain power spectral density (PSD) values representing nodal displacement, nodal acceleration, nodal velocity, and element stress for one or more selected structural elements of the model;
averaging one or more of the obtained PSD values over a user-selected frequency range to evaluate effects of excitation-structural coupling on the structure; and
based on the averaging of the one or more obtained PSD values:
adjusting the design parameters;
providing the adjusted design parameters to the model; and
repeating at least the applying, selecting, and using steps to obtain an optimized design;
the method performed by one or more processors and memory.

9. The method of claim 8, further comprising applying one or more initial conditions selected by the user to the model to obtain the data.

10. The method of claim 8, wherein the data includes one or more natural frequencies, one or more mode shapes, and a mass matrix.

11. The method of claim 8, wherein the selected analysis method includes at least one of mode superposition and mode acceleration.

12. The method of claim 8, wherein applying an excitation condition comprises applying one selected from the following: a progressive wave, a reverberant wave, a turbulent boundary layer, a base excitation, a plane wave, and a point load.

13. The method of claim 8, wherein the one or more initial stresses include at least one of a thermal condition and a pressure condition.

14. A system for designing a structure comprising one or more processors and memory configured to:
receive one or more design parameters selected by a user;
input the design parameters to a parametric model of the structure;
represent one or more excitation conditions specified by the user as one or more input power spectral density (PSD) values;
apply one or more boundary conditions and one or more of the input PSD values to the model to obtain frequency-domain data descriptive of a response of the structure to the one or more excitation conditions;
based on a type of input PSD representing at least one of the one or more specified excitation conditions, select one of a plurality of modal response analysis methods;
use the selected analysis method to analyze the data to obtain power spectral density (PSD) values representing effects of excitation-structural coupling on one or more selected structural elements of the model;
wherein the obtained PSD values comprise at least one of values representing nodal displacement, nodal acceleration, nodal velocity and element stress;
averaging one or more of the obtained PSD values over a user-selected frequency range to evaluate effects of excitation-structural coupling on the structure; and
based on the one or more obtained PSD values:
adjust the design parameters;
provide the adjusted design parameters to the model; and
repeat at least the applying and using to obtain an optimized design.

15. The system of claim 14, wherein the processor is further configured to apply one or more initial conditions selected by the user to the model to obtain the data.

16. The system of claim 14, wherein the data comprises one or more natural frequencies, one or more mode shapes, and a mass matrix.

17. The system of claim 14, wherein the response analysis methods comprise mode superposition and mode acceleration.

18. The system of claim 14, wherein configured to apply an excitation condition comprises configured to apply one selected from the following: a progressive wave, a reverberant wave, a turbulent boundary layer, a base excitation, a plane wave, and a point load.

19. The system of claim 14, wherein the processor is further configured to input data to the model representing initial stress conditions affecting the structure prior to application of the one or more excitation conditions.

* * * * *